United States Patent
Shaddock (10) Patent No.: US 6,518,600 B1
(45) Date of Patent: Feb. 11, 2003

(54) DUAL ENCAPSULATION FOR AN LED

(75) Inventor: David Mulford Shaddock, Troy, NY (US)

(73) Assignee: General Electric Company, Niskayuna, NY (US)

(*) Notice: Subject to any disclaimer, the term of this patent is extended or adjusted under 35 U.S.C. 154(b) by 18 days.

(21) Appl. No.: 09/714,434

(22) Filed: Nov. 17, 2000

(51) Int. Cl.$^7$ .......................... H01L 21/00; H01L 21/50
(52) U.S. Cl. ........................ 257/98; 438/126; 438/26; 438/29; 438/116; 257/82; 257/84; 257/99; 257/100
(58) Field of Search .................. 257/79–85, 98–100, 257/459–460, 729, 790–796; 438/26, 29, 116, 121–127, FOR 287, 369, 416–7; 350/239, 216, 214.1

(56) References Cited

U.S. PATENT DOCUMENTS

| | | | |
|---|---|---|---|
| 4,178,274 A | 12/1979 | Denk et al. | 260/31.8 |
| 4,336,367 A | 6/1982 | Morris et al. | 524/770 |
| 4,454,201 A | 6/1984 | Uram, Jr. | 428/413 |
| 4,661,419 A | 4/1987 | Nakamura | 428/691 |
| 4,783,695 A | 11/1988 | Eichelberger et al. | 357/65 |
| 4,933,042 A | 6/1990 | Eichelberger et al. | 156/239 |
| 5,108,825 A | 4/1992 | Wojnarowski et al. | 428/209 |
| 5,145,889 A | 9/1992 | Wada et al. | 523/451 |
| 5,198,479 A | 3/1993 | Shiobara et al. | 523/214 |
| 5,198,679 A | 3/1993 | Katoh et al. | 250/484.1 |
| 5,226,053 A | 7/1993 | Cho et al. | 372/45 |
| 5,353,498 A | 10/1994 | Fillion et al. | 29/840 |
| 5,527,741 A | 6/1996 | Cole et al. | 437/209 |
| 5,571,451 A | 11/1996 | Srivastava et al. | 252/301.4 |
| 5,813,753 A | 9/1998 | Vriens et al. | 362/293 |
| 5,847,507 A | 12/1998 | Butterworth et al. | 313/512 |
| 5,851,063 A | 12/1998 | Doughty et al. | 362/231 |
| 5,895,932 A | 4/1999 | Bojarczuk, Jr. et al. | 257/103 |
| 5,898,185 A | 4/1999 | Bojarczuk, Jr. et al. | 257/103 |
| 5,925,897 A | 7/1999 | Oberman | 257/80 |
| 5,966,393 A | 10/1999 | Hide et al. | 372/23 |
| 5,998,925 A | 12/1999 | Shimizu et al. | 313/503 |
| 6,066,861 A | 5/2000 | Höhn et al. | 257/99 |
| 6,069,440 A | 5/2000 | Shimizu et al. | 313/486 |
| 6,335,548 B1 * | 1/2002 | Roberts et al. | 200/540 |
| 2001/0026011 A1 * | 10/2001 | Roberts et al. | 257/678 |
| 2002/0056806 A1 * | 5/2002 | Bechtel et al. | 250/214.1 |

OTHER PUBLICATIONS

Keith Butler: Fluorescent Lamp Phosphors, pp. 98–107 (The Pennsylvania State University Press 1980).
S. Nakamura et al.: The Blue Laser Diode, pp. 216–221, 328–329 (Springer 1997).
G. Blasse et al.: Luminescent Materials, pp. 109–110 (Springer–Verlag 1994).

* cited by examiner

Primary Examiner—Wael Fahmy
Assistant Examiner—Thanh V Pham
(74) Attorney, Agent, or Firm—Foley & Lardner (57) ABSTRACT

An encapsulated device comprises a solid state device, a first encapsulating material and a second encapsulating material having a higher thermal conductivity than the first encapsulating material. The solid state device may be an LED. The first encapsulating material located above the LED may be transparent to LED light or radiation, while the second encapsulating material located below the LED may have a high thermal conductivity to decrease the LED operating temperature.

24 Claims, 9 Drawing Sheets

DUAL ENCAPSULATION FOR AN LED

BACKGROUND OF THE INVENTION

This invention relates generally to semiconductor device packaging and specifically to a light emitting diode ("LED") containing two encapsulation layers.

Semiconductor light emitting diodes are semiconductor chips that are mounted in a package and emit radiation in response to an applied voltage or current. These LEDs are used in a number of commercial applications such as automotive, display, safety/emergency and directed area lighting. A high brightness is desired for these applications. In the conventional LEDs, in order to obtain a higher LED brightness, the current to the LED was increased. However, an increase in current also causes an increase in the LED operating or junction temperature. This increase in junction temperature undesirably reduces the LED efficiency and its operating lifetime.

The present invention is directed to overcoming or at least reducing the problems set forth above.

BRIEF SUMMARY OF THE INVENTION

In accordance with one aspect of the present invention, there is provided an encapsulated device, comprising a solid state device, a first encapsulating material, and a second encapsulating material having a higher thermal conductivity than the first encapsulating material.

In accordance with another aspect of the present invention, there is provided a packaged light emitting diode, a light emitting diode chip, a lead frame electrically coupled to the light emitting diode chip, a first encapsulating material above a radiation emitting surface of the light emitting diode chip, and a second encapsulating material below the radiation emitting surface of the light emitting diode chip having a higher thermal conductivity than the first encapsulating material.

In accordance with another aspect of the present invention, there is provided a method of encapsulating a semiconductor device, comprising placing the semiconductor device into a package, placing a first encapsulating material into the package, and placing a second encapsulating material having a higher thermal conductivity than the first encapsulating material into the package.

In accordance with another aspect of the present invention, there is provided a method of encapsulating a semiconductor device, comprising placing the semiconductor device into an enclosure, simultaneously placing a first encapsulating material and a second encapsulating material having a higher thermal conductivity than the first encapsulating material into the enclosure, and wherein a specific gravity of the first encapsulating material is different than a specific gravity of the second encapsulating material such that an encapsulating material with a lower specific gravity separates above an encapsulating material with a higher specific gravity.

DETAILED DESCRIPTION OF THE INVENTION

In view of the problems in the prior art, it is desirable to obtain a thermally enhanced LED which can be operated at a higher current without significantly decreasing the device lifetime and light output. The present inventor has discovered that LED operating or junction temperature may be reduced by using two encapsulating materials with different thermal conductivity properties. A first encapsulating material is preferably added above the light emitting surface of the LED. The first encapsulating material is selected such that it has a high transparency to LED radiation. A second encapsulating material is preferably added below the light emitting surface of the LED. The second encapsulating material is selected such that it has a high thermal conductivity to provide improved thermal conductivity between the LED chip and/or its lead frame and the ambient environment.

Thus, in a preferred aspect of the present invention, the first encapsulating material is optimized to be transparent to the LED radiation and the second encapsulating material is optimized for a high thermal conductivity. Most preferably, the first encapsulating material absorbs less LED radiation than the second encapsulating material, while the second encapsulating material has a higher thermal conductivity than the first encapsulating material. Therefore, by using two encapsulating materials, the LED can operate at a lower junction temperature due to the high thermal conductivity second encapsulating material without decreasing the amount of transmission of LED radiation, such as visible, ultraviolet or infrared radiation, due to the low absorption first encapsulating material. The lower junction temperature of the LED provides for increased LED radiation output, longer device lifetime and the ability of the LED to operate at a higher current.

Figure 1:
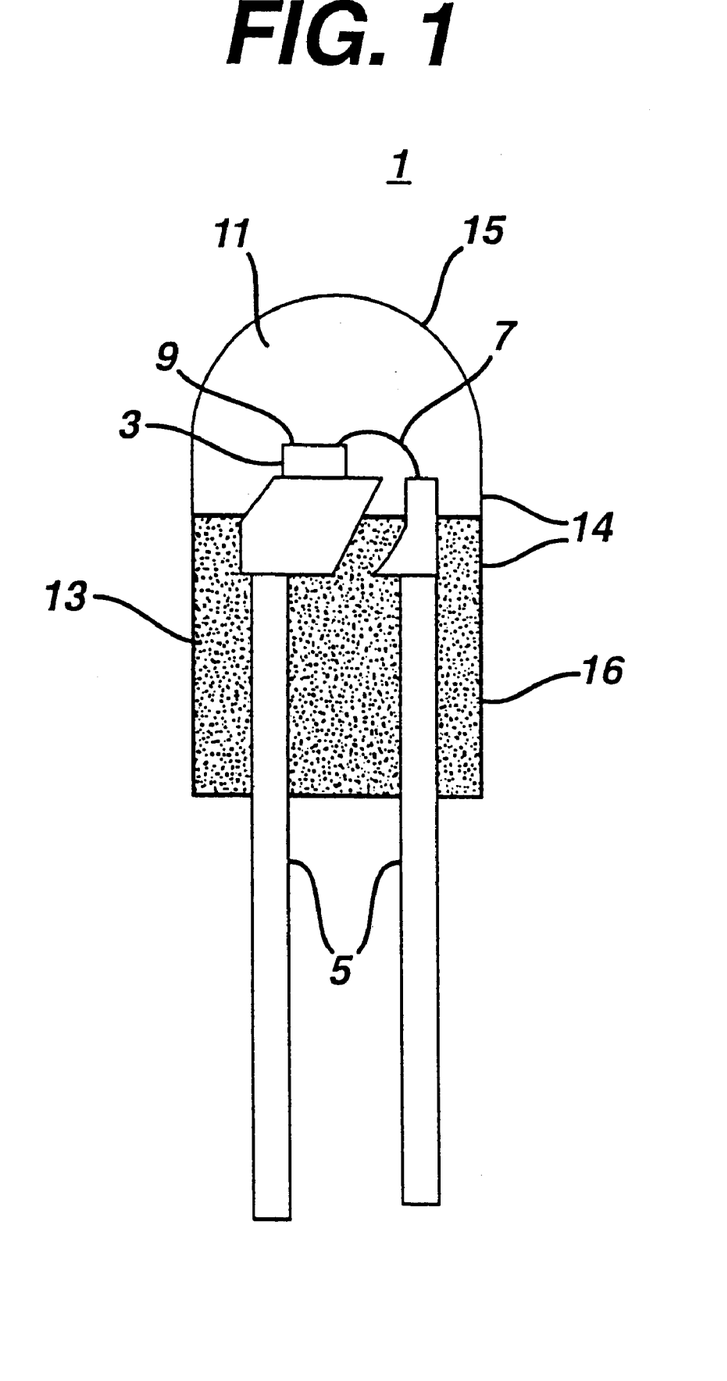
FIG. 1 is a schematic illustration of a LED according to one preferred embodiment of the present invention.

FIG. 1 schematically illustrates an LED 1 according to one preferred embodiment of the present invention. The LED contains an LED chip 3 electrically connected to a lead frame 5. For example, the LED chip 3 may be directly electrically connected to an anode or cathode electrode of the lead frame 5 and connected by a lead or wire 7 to the opposite cathode or anode electrode of the lead frame 5, as illustrated in FIG. 1. In the preferred embodiment illustrated in FIG. 1, the lead frame 5 supports the LED chip 3. However, the lead 7 may be omitted, and the LED chip 3 may straddle both electrodes of the lead frame 5 with the bottom of the LED chip 3 containing the contact layers which contact the both the anode and cathode electrode of the lead frame 5. Alternatively, the LED chip 3 may be connected with a separate lead 7 to the cathode and the anode electrode of the lead frame 5. The lead frame 5 connects to a power supply, such as a current or voltage source or to another circuit (not shown).

The LED chip 3 emits radiation from the radiation emitting surface 9. The LED may emit visible, ultraviolet or infrared radiation. The LED chip may comprise any LED chip containing a p-n junction of any semiconductor layers capable of emitting the desired radiation. For example, the LED chip may contain any desired III-V compound semiconductor layers, such as GaAs, GaAlAs, GaN, InGaN, GaP, etc., or II-VI compound semiconductor layers such ZnSe, ZnSSe, CdTe, etc., or IV-IV semiconductor layers, such as SiC. The LED chip 3 may also contain other layers, such as cladding layers, waveguide layers and contact layers.

The LED 1 is packaged with at least two encapsulating materials. The first encapsulating material 11 is preferably located above the radiation emitting surface 9 of the LED chip 3, while the second encapsulating material 13 is preferably located below the radiation emitting surface 9 of the LED chip 3. However, the materials 11 and 13 do not have to be located entirely above and below the radiation emitting surface 9, respectively. For example, a portion of the first encapsulating material 11 may extend below the radiation emitting surface 9 in order to optimize the transmission of LED radiation toward the sides of the LED 1, as shown in FIG. 1. Furthermore, the second encapsulating material 13 may extend partially above the radiation emitting surface 9 if it is desired to increase the thermal conductivity between the LED chip 3 and the outside ambient. Preferably both materials 11, 13 comprise polymer materials.

The first encapsulating material 11 may be any encapsulating material which allows a high transmission of the LED radiation. In other words, the first encapsulating material is selected to minimize the absorption of LED radiation. For LEDs that emit visible light, the first encapsulating material 11 is preferably clear or transparent, or at least translucent to the light emitted by the LED. Alternatively, the first encapsulating material 11 may be colored if it is desired to filter or change the color of the light emitted by the LED. In a preferred aspect of the present invention, the first encapsulating material comprises an epoxy, such as a cycloaliphatic or BPA epoxy, a silicone, or a glass material.

Epoxy resins useful in the preferred embodiments of the present invention include those described in "Chemistry and Technology of the Epoxy Resins" B. Ellis (Ed.) Chapman Hall 1993, New York and "Epoxy Resins Chemistry and Technology" C. May and Y.Tanaka, Marcell Dekker 1972, New York, incorporated herein by reference. For example, the epoxy resins include those resins are be produced by reaction of a hydroxyl, carboxyl or amine containing compound with epichlorohydrin, preferably in the presence of a basic catalyst, such as a metal hydroxide (i.e., sodium hydroxide etc.). Also included are epoxy resins produced by reaction of a compound containing at least one and preferrably two or more carbon-carbon double bonds with a peroxide, such as a peroxyacid.

Specific examples of the preferred epoxy resins useful as the first encapsulating material 11 include bisphenol-A (BPA) type epoxy resins, bisphenol-F (BPF) type epoxy resins, phenol novolac (EPN) type epoxy resins, cresol-novolac (ECN) type epoxy resins, biphenol type epoxy resins, biphenyl type epoxy resins, cyclopentadiene type epoxy resins, aliphatic epoxy resins and cycloaliphatic epoxy resins. The BPA and cycloaliphatic epoxy resins are most preferred.

Aliphatic epoxy resins include compounds which contain at least one aliphatic group and at least one epoxy group within its structure. Examples of preferred aliphatic epoxies include, butadiene dioxide, dimethylpentane dioxide, diglycidyl ether, 1,4-butanedioldiglycidyl ether, diethylene glycol diglycidyl ether, dipentene dioxide.

Cycloaliphatic epoxies are compounds which contain about one cycloaliphatic group and at least two oxirane rings per molecule. Specific examples of the preferred cycloaliphatic epoxies include:

2-(3,4-epoxy)cyclohexyl-5,
5-spiro-(3,4-epoxy)cyclohexane-m-dioxane,
3,4-epoxycyclohexylalkyl-3,
4-epoxycyclohexanecarboxylate,
3,4-epoxy-6-methylcyclohexylmethyl-3,
4-epoxy-6methylcyclohexanecarboxylate,
vinyl cyclohexane dioxide,
Bis(3,4-epoxycyclohexylmethyl)adipate,
Bis(3,4-epoxy-6-methylcyclohexylmethyl)adipate,
exo-exo bis(2,3-epoxycyclopentyl) ether,
endo-exo bis(2,3-epoxycyclopentyl)ether,
2,2-bis(4-(2,3-epoxypropoxy)cyclohexyl)propane,
2,6-bis(2,3-epoxypropoxycyclohexyl-p-dioxane),
2,6-bis(2,3-epoxypropoxy)norbonene,
the diglycidylether of linoleic acid dimer,
limonene dioxide,
2,2-bis(3,4-epoxycyclohexyl)propane,
dicyclopentadiene dioxide,
1,2-epoxy-6-(2,3-epoxypropoxy)hexahydro-4,7-methanoindane,
p-(2,3-epoxy)cyclopentylphenyl-2,3-epoxypropylether,
1-(2,3-epoxypropoxy)phenyl-5,6-epoxyhexahydro-4,7-methanoindane,
o-(2,3-epoxy)cyclopentylphenyl-2,3-epoxypropyl ether,
1,2-bis[5-(1,2-epoxy)-4,7-hexahydromethanoindanoxyl] ethane,
cyclopentenyiphenyl glycidyl ether,
cyclohexanediol diglycidyl ether, and
diglycidyl hexahydrophthalate.

Resins which may be used as flexibilizers are also preferred. Examples of such resins include aliphatic epoxy resins, such as butanedioldiglycidyl ether, and siloxane resins. Other resins, such as polyfunctional epoxy resins, divinylbenzene dioxide, 2-glycidylphenylglycidyl ether and combinations of epoxies such as a combination of epichlorohydrine and BPA may also be used. The encapsulating material may also contain other optional components, such as curing agents and stabilizers.

The second encapsulating material 13 may be any encapsulating material that has a higher thermal conductivity than the first encapsulating material 11. Because the second encapsulating material 13 is preferably located below the radiation emitting surface 9, the second encapsulating material 13 may have a higher absorption of LED radiation than the first encapsulation material 11 and may be transparent or opaque. In the preferred aspect of the present invention, the second encapsulating material 13 comprises a filled epoxy. The material 13 may contain thermally conductive particles to increase its thermal conductivity. For example, the thermally conductive particles may comprise metal particles, silica particles or diamond powder particles. Such epoxies are supplied by Hysol, Emerson & Cuming, Norcast, Lord, Loctite, Plaskon, and Amiconl. The compositions of such epoxies is usually a trade secret of the manufacturer. Examples of filled epoxies include combinations of bisphenol A and epichlorohydrine containing the thermally conductive particles. The filled epoxies may optionally contain curing agents, such as amine, ethylene diamine, anhydride, and phthallic anhydride. Any other class I materials outlined in *Encapsulation of Electronic Devices and Components* by Salmon (Marcel Dekker, 1987) that are filled with a thermally conductive and electrically insulating material could be used. While the LED 1 has been described as containing two encapsulating materials, it may contain three or more encapsulating materials if desired.

The LED packaging may include the first and second encapsulating materials 11, 13 that are located in package, such as a shell 14. The shell may be any plastic or other material, such as polycarbontate, which is transparent to the LED radiation. Preferably, the shell 14 may be omitted to simplify processing if the encapsulating materials 11, 13 have sufficient toughness and rigidity to be used without a shell. Thus, the outer surface of the encapsulating materials 11, 13 would act as a shell 14 or package. The shell 14 contains a first light or radiation emitting surface 15 above the LED chip 3. The radiation emitting surface 15 may be curved to act as a lens and/or may be colored to act as a filter. The second surface 16 of the shell 14 may be transparent or opaque to the LED radiation, and may be made of opaque materials, such as metal. The shell 14 may also contain a reflector around the LED chip 3, or other components, such as resistors, etc., if desired.

Furthermore, one or both encapsulating materials may optionally contain a phosphor to optimize the color output of the LED. For example, the phosphor may be interspersed or mixed as a phosphor powder with the first encapsulating material 11 or coated as a thin film on the LED chip 3 or coated on the inner surface of the shell 14. Any phosphor material may be used with the LED chip. For example, a yellow emitting cerium doped yttrium aluminum garnet phosphor (YAG:$Ce^{3+}$) may be used with a blue emitting InGaN active layer LED chip to produce a visible yellow and blue light output which appears white to a human observer. Of course, other combinations of LED chips and phosphors may be used as desired.

While the packaged LED chip 3 according to the preferred embodiment illustrated in FIG. 1 is supported by the lead frame 5, the LED 1 can have various other structures. For example, the LED chip 3 may be supported by the bottom surface 16 or by a pedestal (not shown) located on the bottom of the shell 14, instead of by the lead frame 5.

Figure 2:
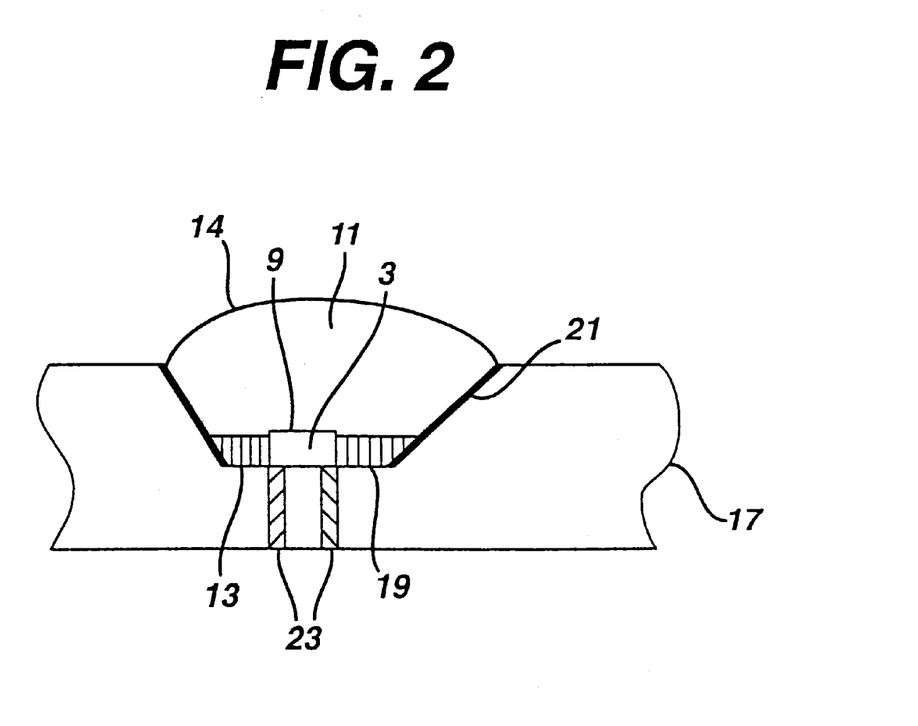
FIG. 2 is a schematic illustration of a LED according to another preferred embodiment of the present invention.

In an alternative embodiment of the present invention, the LED chip may be supported by a carrier substrate 17, as illustrated in FIG. 2. The carrier substrate 17 comprises a lower portion of the LED package, and may comprise any material, such as plastic, metal or ceramic. Preferably, the carrier substrate is made out of plastic and contains a cavity 19 in which the LED chip 3 is located. The sides of the cavity 19 may be coated with a reflective metal 21, such as aluminum, which acts as a reflector. However, the LED chip 3 may be formed over a flat surface of the substrate 17. The substrate 17 contains electrodes 23, which electrically contact the contact layers of the LED chip 3. Alternatively, the electrodes 23 may be electrically connected to the LED chip 3 with one or two leads as illustrated in FIG. 1. If desired, a shell 14 or a glass plate may be formed over the first and second encapsulating materials 11, 13 to act as a lens or protective material. Preferably, the shell 14 may be omitted to simplify processing and the encapsulating materials 11, 13 have sufficient toughness and rigidity to use the outer surface of the encapsulating materials form a lens or protective shell.

Figure 3:
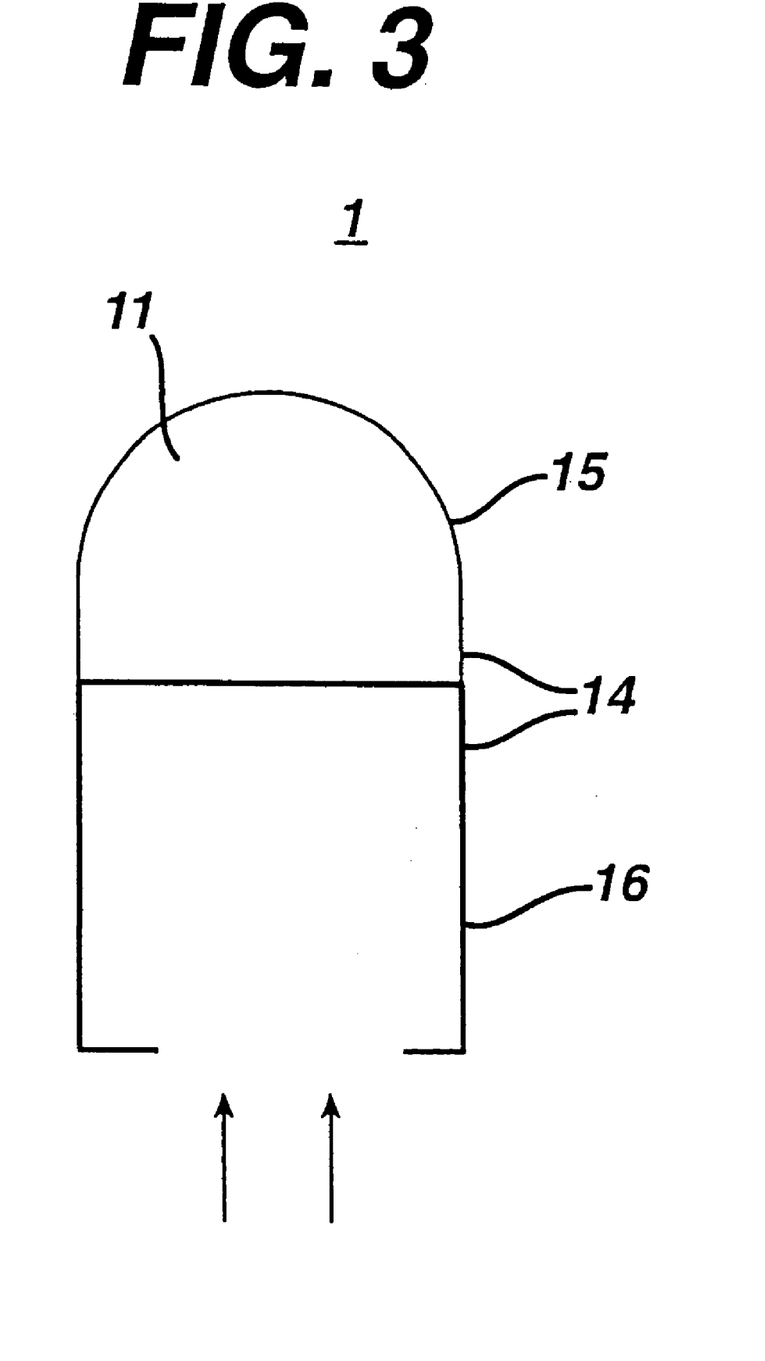
FIGS. 3–5 are schematic illustrations of a method of making an LED according to one preferred embodiment of the present invention.
Figure 4:
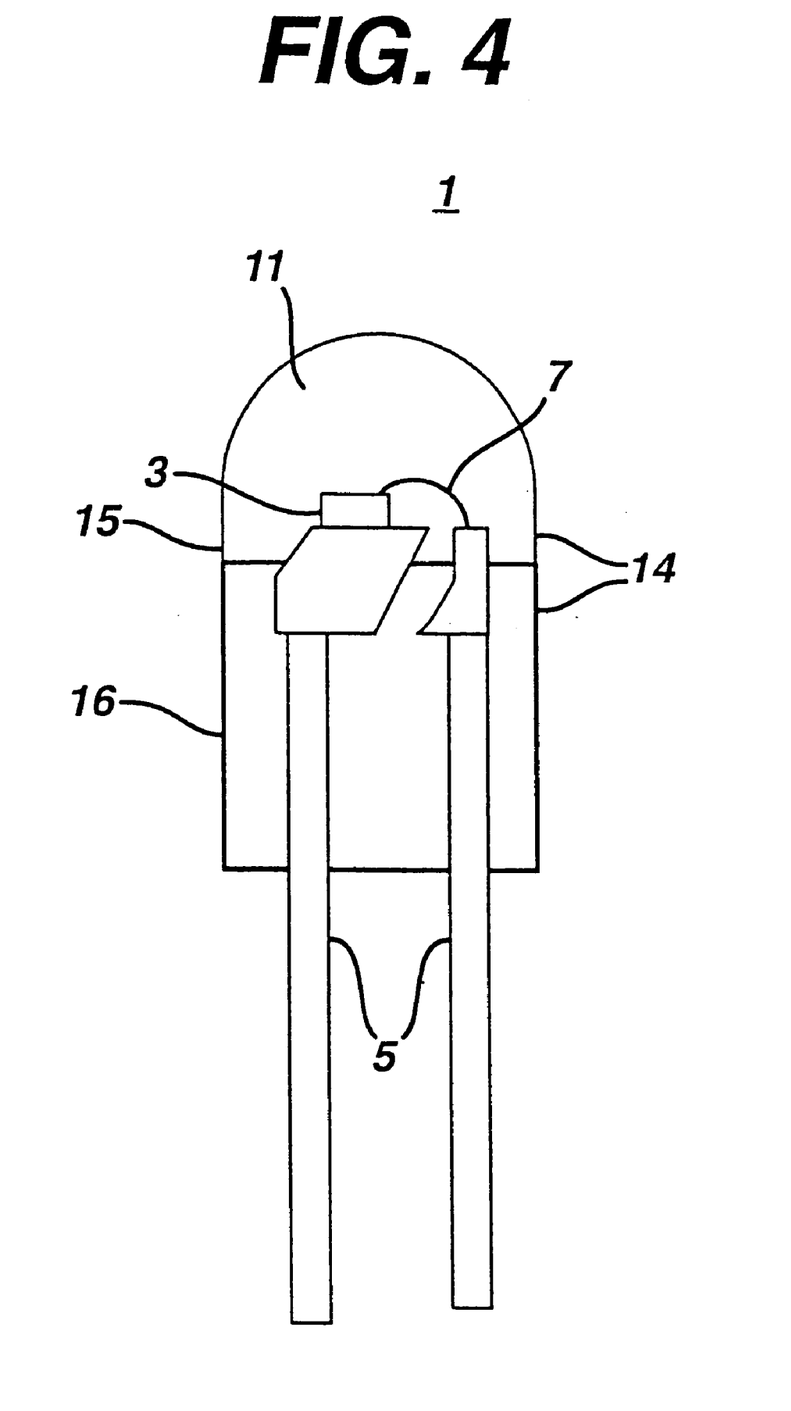
Figure 5:
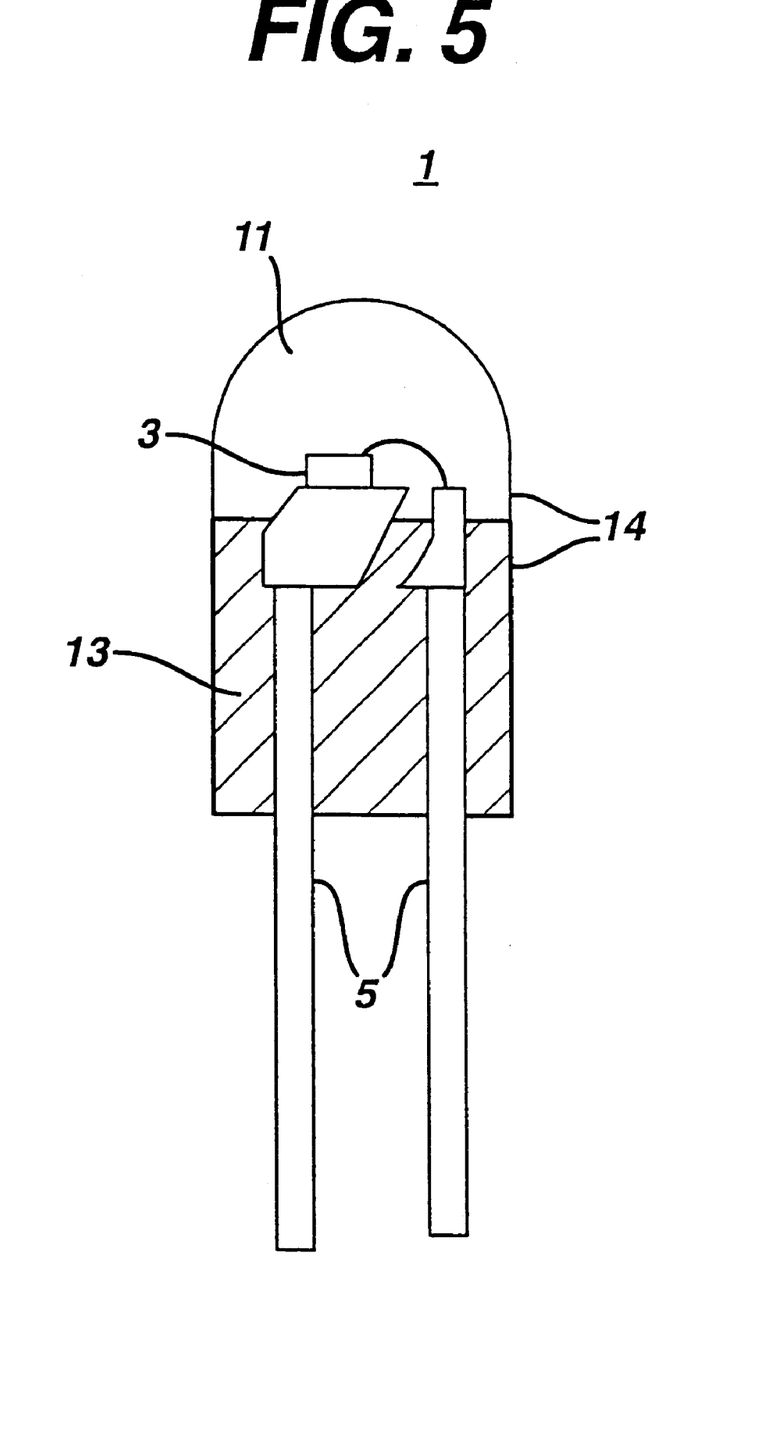

The LED 1 may be made by any desired method. For example, a method of making the LED according to a first preferred aspect of the first preferred embodiment of the present invention is illustrated in FIGS. 3, 4 and 5. First, the first encapsulating material 11 is added to the shell 14 through an opening, as illustrated in FIG. 3. The shell 14 may comprise a material that is used as a part of the finished LED, such as polycarbonate.

Second, the LED chip 3, the lead frame 5 and lead(s) 7, if present, are added to the shell 14 or mold cavity such that the LED chip 3 contacts the first encapsulating material 11, as illustrated in FIG. 4. If desired, the first encapsulating material 11 may contain the phosphor powder or the phosphor layer may be coated on the LED chip 3 or the shell 14. Preferably, the first encapsulating material 11 is at least partially cured by heating and/or irradiation to at least partially solidify the first encapsulating material 11 in the top (i.e., the radiation transparent) portion 15 of the shell, either before or after adding the LED chip 3.

Third, the second encapsulating material 13 is added to the shell 14 through an opening (not shown), preferably to a level below the radiation emitting surface 9 of the LED chip 3, as illustrated in FIG. 5. Preferably, the second encapsulating material 13 contacts at least the lead frame 5 and optionally the bottom portion of the LED chip 3. After adding the second encapsulating material, the first and second encapsulating materials 11, 13 are preferably fully cured by heating and/or irradiation to form the LED 1 illustrated in FIG. 1. Alternatively, the first curing step may be omitted and both encapsulating materials may be cured after the second encapsulating material 13 is added to the shell 14. Furthermore, the first encapsulating material 11 may be fully cured prior to adding the second encapsulating material, if desired. Furthermore, the shell 14 may be held with side 15 up, down or sideways during filling.

Figure 6:
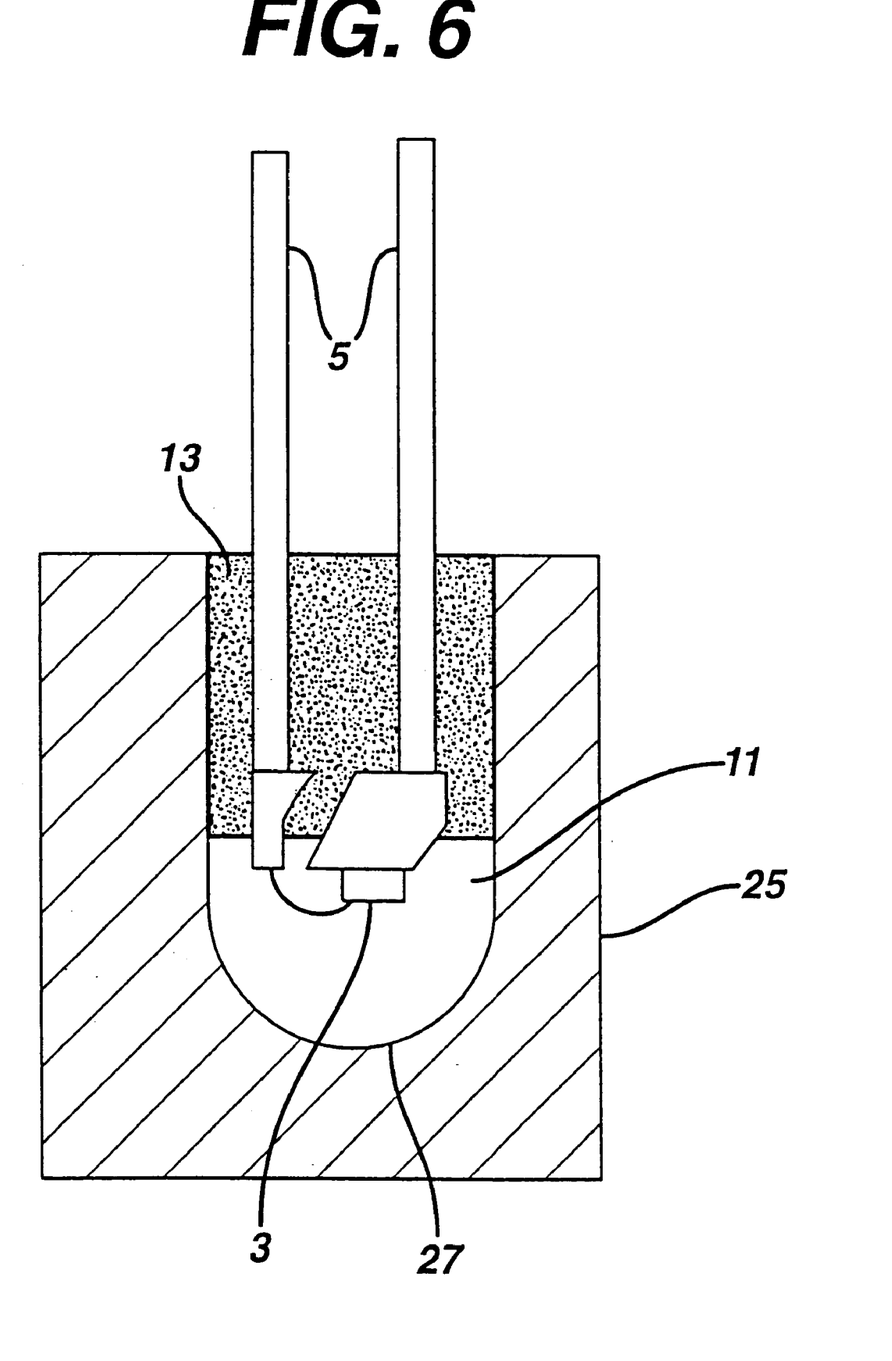
FIG. 6 is a schematic illustration of a method of making an LED according to another preferred embodiment of the present invention.

FIG. 6 illustrates a second preferred aspect of the first preferred embodiment of the present invention, where the first and/or second encapsulating materials 11, 13 are cured in a mold 25 rather than in a polycarbonate shell 14. For example, the first encapsulating material 11 may be added to an appropriately shaped mold cavity 27 of mold 25, followed by the addition of the LED chip 3, lead frame 5 and optionally lead(s) 7. The first encapsulating material 11 is then preferably at least partially cured and the second encapsulating material 13 is then added and at least partially cured, and preferably fully cured to form the structure illustrated in FIG. 6. The LED chip 3, lead frame 5 and the encapsulating materials 11, 13 are then removed from the mold and may be used as is (with the outer surface of the materials 11, 13 functioning as the shell 14) or subsequently placed in a shell 14 to form the structure illustrated in FIG. 1. Alternatively, the LED chip 3 and lead frame 5 may be placed on the carrier substrate 17. Furthermore, the lead frame 5 and lead 7 may be omitted, and the encapsulated LED chip 3 may be placed in contact with the electrodes 23 in the carrier substrate 17, as illustrated in FIG. 2.

Figure 7:
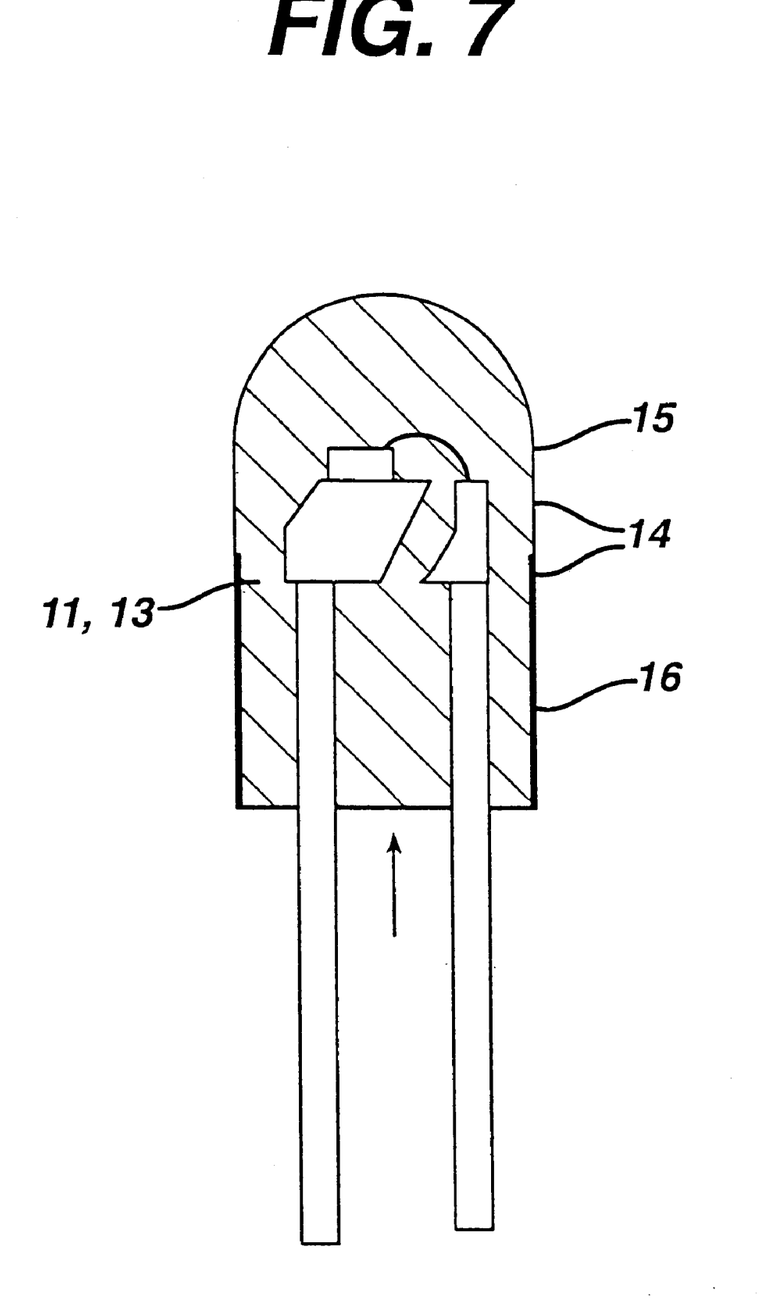
FIGS. 7–8 are schematic illustrations of a method of making an LED according to another preferred embodiment of the present invention.
Figure 8:
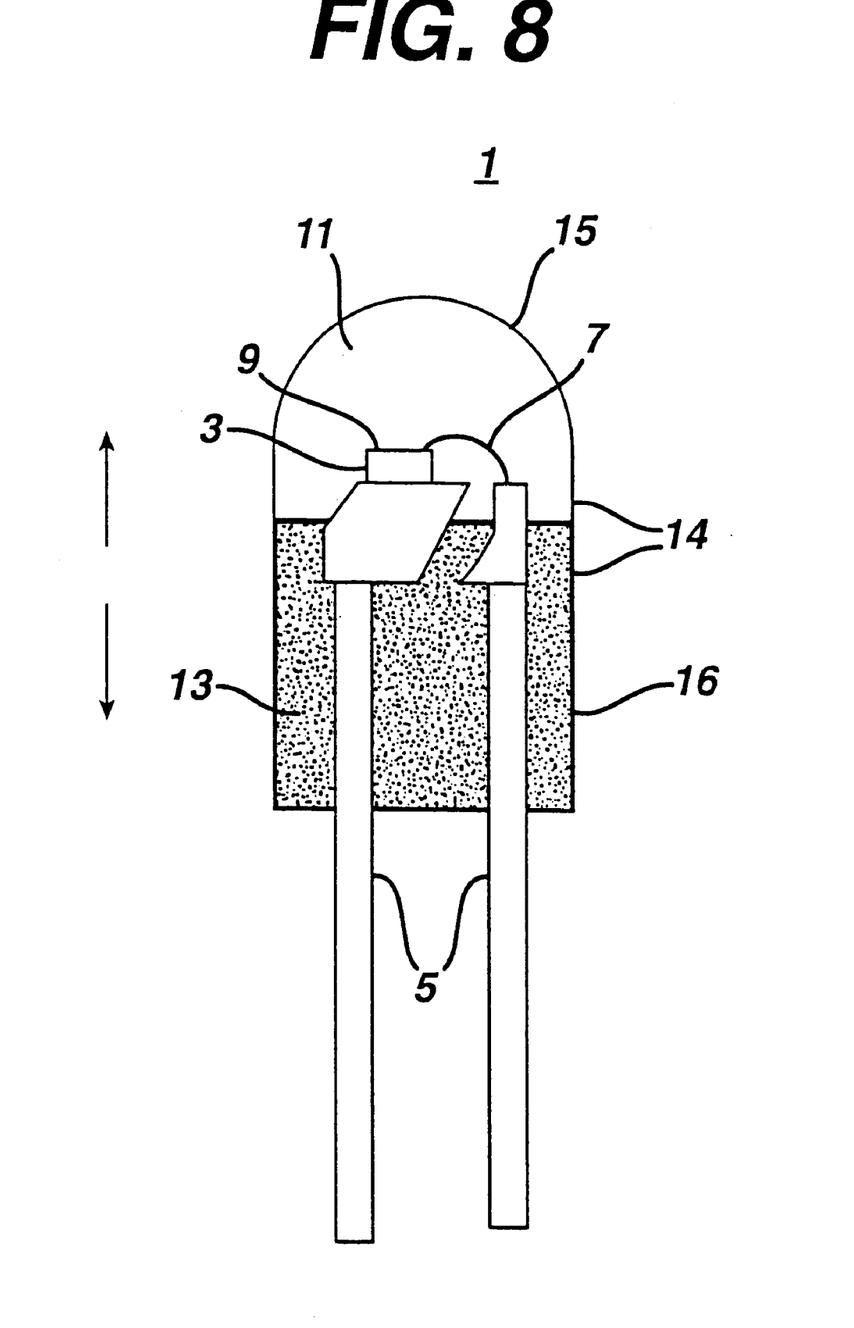

FIGS. 7 and 8 illustrate a method of making the LED according to a second preferred embodiment of the present invention. The method according to the second preferred embodiment utilizes the difference in specific gravity between the first and second encapsulating materials 11, 13 to achieve separation of these materials when they are added to the shell 14 or mold cavity 27. Preferably, the first and second encapsulating materials 11, 13 are added to the shell 14 or temporary mold cavity 27 at the same time in the method of this embodiment. As described above, if desired, a phosphor material may optionally be added to the first encapsulating materials 11, 13, placed over the radiation emitting surface 9 or placed on the surface of the shell 14.

As illustrated in FIG. 7, the shell 14 is held with the radiation emitting (i.e., top) surface 15 pointing up, away from the ground. The LED chip 3 is placed into the shell 14. The first and second encapsulating materials 11, 13 are then added to the shell, preferably from below the LED chip 3 through an opening (not shown). The first encapsulating material 11 according to this aspect of the second embodiment has a lower specific gravity than the second encapsulating material 13. The difference in specific gravity causes the two encapsulating materials 11, 13 to separate, with the first encapsulating material 11 raising toward the radiation emitting surface 15 of the shell 14 and the second encapsulating material lowering toward the non-emitting surface 16 of the shell 14 containing the lead frame 5, as illustrated by the arrows in FIG. 8. The first and second encapsulating materials 11, 13 are then preferably cured after separation by gravity or centripetal force. If desired, a mold cavity 27 illustrated in FIG. 6 may be used instead of the shell 14.

An example of the preferred first encapsulating material 11 of the second embodiment includes epoxies such as bisphenol A (BPA) and a combination of bisphenol A and epichlorohydrine. Examples of the preferred second encapsulating material 13 includes epoxies containing thermally conductive particles to increase the thermal conductivity of the material. For example, the thermally conductive particles may comprise metal particles, silica particles or diamond powder particles. Some examples of filled epoxies are supplied by Hysol, Emerson & Cuming, Norcast, Lord, Loctite, Plaskon, and Amicon. Examples of epoxies include combinations of bisphenol A and epichlorohydrine containing the filler particles. The epoxies may optionally include curing agents, such as amine, ethylene diamine, anhydride, and phthallic anhydride and stabilizers. Any other class I materials outlined in *Encapsulation of Electronic Devices and Components* by Salmon (Marcel Dekker, 1987) that are filled with a thermally conductive and electrically insulating material could be used. For example, the first encapsulating material 11 may comprise a Hysol ST-1 transparent BPA epoxy having a specific gravity of 1.16 and the second encapsulating material 13 may comprise an Emerson & Cuming Stycast 1495 epoxy which has a specific gravity of 1.9.

While the encapsulated device is preferably an LED chip, the present invention is not limited to LED encapsulation. Any solid state or semiconductor device may be encapsulated with the first and second encapsulating materials 11, 13. For example, the encapsulated device may be another light emitting device, such as a semiconductor laser, which utilizes the high thermal conductivity of the second encapsulating material 13 and the high transparency of the first encapsulating material 11. Alternatively, the encapsulated device may be any semiconductor device, such as a phototransistor, photodiode (i.e., photodetector), a CCD chip, DRAM, SRAM, ASIC, EEPROM, mask ROM, microprocessor or any other semiconductor device, chip or circuit. These devices may also advantageously utilize the high thermal conductivity of the second encapsulating material 13 to improve the operating characteristics of the device and the high transparency of the first encapsulating material 11 to allow easy observation of the device.

SPECIFIC EXAMPLE

The thermal resistance of the prior art packages containing a single transparent encapsulating material was compared to the thermal resistance of packages that contain two encapsulating materials according to the preferred embodiments of the present invention. Two groups of samples were prepared. The prior art LEDs (group I) were encapsulated with a single transparent epoxy using the standard process used to encapsulate LEDs. The LEDS according to the preferred embodiments of the present invention (group II) were encapsulated with the same transparent epoxy and an additional thermally conductive epoxy. The transparent epoxy encapsulated the portion of the LED above the die level and the thermally conductive epoxy encapsulated the portion below the die level. The thermal resistance of the two groups of samples were measured and compared using a t-test.

Hysol ST-1 transparent epoxy was dispensed using an EFD liquid dispenser into 10 mold cavities to fill each cavity for making the prior art LEDs (group I). Another 10 cavities of the same mold were partially filled with Hysol ST-1 transparent epoxy so that the level of epoxy in these cavities corresponds to the top of the lead frame cup when inverted into the mold (group II). A 5 mm lead frame containing twenty LED chips was inverted and the LEDs chips were inserted the into the 20 mold cavities. The lead frame and LED chip height was then adjusted. It was determined that two of the LEDs of group I were defective and were not used further in the experiment. The mold containing the lead frame and LED chips was placed into a curing oven and heated at 150° C. for 1 hour to partially cure the Hysol ST-1 epoxy. The mold was removed from the oven and cooled to room temperature. The remaining space in the 10 partially filled cavities (group II) was filled with a mixture of Emerson & Cuming Stycast 1495 epoxy and Catalyst 9 (i.e., a thermally conductive encapsulating mixture). The Stycast mixture was cured at room temperature for 16 to 24 hours. The mold with the completely encapsulated lead frame and LED chips was then placed into an oven at 150° C. for 3 to 4 hours for a final curing. Three sample LEDs were taken randomly from each of group I and group II (6 LEDs total were selected) and their thermal resistance was measured at 10, 20, 30, 40 and 50 mA (i.e., 15 total thermal resistance measurements were made in group I and 15 total thermal resistance measurements were made in group II).

The thermal resistance of the prior art LEDs molded with only the Hysol ST-1 epoxy (group I) was compared to the thermal resistance of the LEDs molded with the Hysol ST-1 and the Stycast 1495 epoxy (group II). A t-test was used to determine whether the two groups are significantly different to 95% confidence. A t-test is a statistical test that is used to compare the mean of two groups of measurements to determine whether there is any difference between the two groups or if the observed difference between the means is due to random error. The results of the test are illustrated in Table I, below.

TABLE I

| Encapsulation | Number of measurements | Mean thermal resistance | Standard Deviation | SE Mean |
|---|---|---|---|---|
| GROUP I (single encapsulation) | 15 | 256.8° C./W | 56.7 | 15 |
| GROUP II (dual encapsulation) | 15 | 201.5° C./W | 50.7 | 13 |

The LEDs of group I according to the prior art had a mean thermal resistance of 256.8° C./Watt with a standard deviation of 56.7 and a SE of the mean of 15. The standard error of the mean is a measure of the precision of the calculated mean and is calculated by taking the standard deviation and dividing it by the square root of the sample size. The LEDs of group II according to the preferred embodiments of the present invention had a mean thermal resistance of 201.5° C./Watt with a standard deviation of 50.7 and a standard error ("SE") of the mean of 13. Thus, the LEDs of group II according to the preferred embodiments of the present invention had a 21.5% lower thermal resistance than that LEDs of group I that were encapsulated according to the prior art method. These results indicate that there was a significant difference between the two groups and that the observed difference between the means is not due to random error. Therefore, at least a 10%, and preferably an 11–21.5% reduction in thermal resistance may be achieved by using the dual encapsulation.

Figure 9:
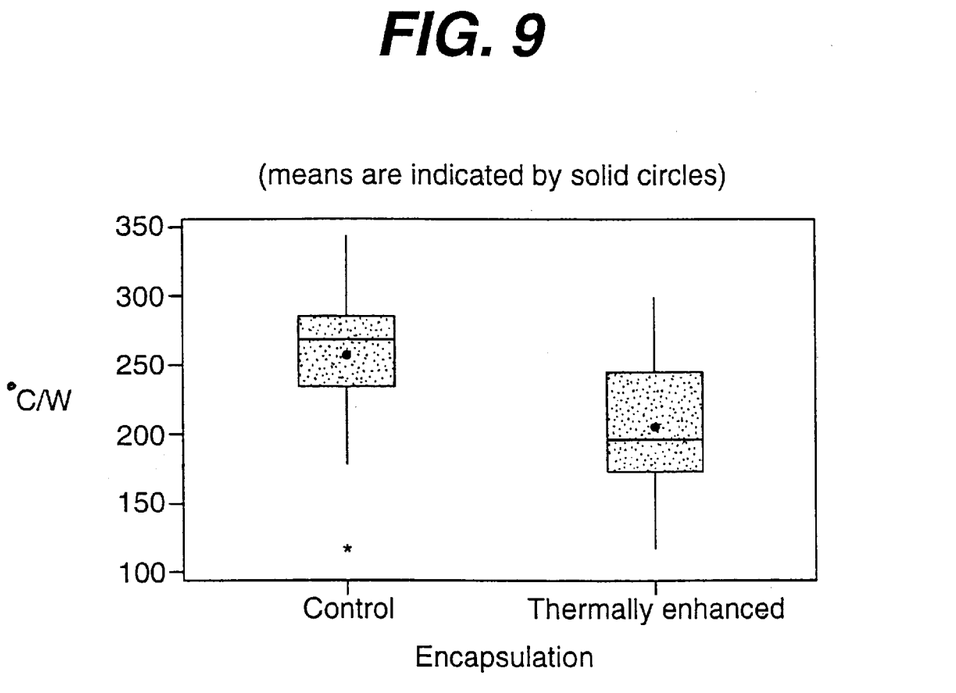
FIG. 9 is a box plot of thermal resistance of LEDs.

The results from Table I are illustrated in FIG. 9, which is a box plot of the thermal resistance of the LEDs from group I (left box or "control") and group II (right box or "thermally enhanced"). The mean values of thermal resistance of each group are indicated by the solid circles and the median values of thermal resistance of each group are indicated by the horizontal lines through each box. One outlier measurement in group I is indicated by a star (*). As illustrated in FIG. 9, by using the dual encapsulation, an LED thermal resistance below 250° C./Watt may be obtained. Preferably, an LED thermal resistance below 225° C./Watt, most preferably between about 160 and about 225° C./Watt may be obtained.

The preferred embodiments have been set forth herein for the purpose of illustration. However, this description should not be deemed to be a limitation on the scope of the invention. Accordingly, various modifications, adaptations, and alternatives may occur to one skilled in the art without departing from the scope of the claimed inventive concept.

What is claimed is:

1. An encapsulated device, comprising:
   a solid state device, wherein the solid state device comprises a semiconductor light emitting diode chip;
   a first encapsulating material;
   a second encapsulating material having a higher thermal conductivity than the first encapsulating material;
   a shell containing the first and second encapsulating materials; and
   a lead frame electrically connected to the light emitting diode chip and in contact with the second encapsulating material;
   wherein the first encapsulating material absorbs less light emitting diode radiation than the second transparent or opaque encapsulating material; and
   wherein the first encapsulating material is located above a radiation emitting surface of the light emitting diode chip and the second encapsulating material is located below the radiation emitting surface of the light emitting diode chip.

2. The device of claim 1, wherein the first and second encapsulating materials comprise polymer materials.

3. The device of claim 2, wherein the first encapsulating material comprises BPA epoxy arid the second encapsulating material comprises epoxy containing thermally conductive metal, silica or diamond particles.

4. The device of claim 1, wherein a specific gravity of the first encapsulating material is lower than a specific gravity of the second encapsulating material.

5. The device of claim 1, further comprising a phosphor above the radiation emitting surface of the light emitting diode chip.

6. A packaged light emitting diode, comprising:
   a light emitting diode chip;
   a lead frame electrically coupled to the light emitting diode chip;
   a first encapsulating material above a radiation emitting surface of the light emitting diode chip;
   a second encapsulating material below the radiation emitting surface of the light emitting diode chip having a higher thermal conductivity than the first encapsulating material; and
   a shell containing the first and second encapsulating materials.

7. The device of claim 6, wherein:
   the first encapsulating material comprises BPA epoxy; and
   the second encapsulating material comprises epoxy containing metal, silica or diamond particles.

8. The device of claim 7, wherein a specific gravity of the first encapsulating material is lower than a specific gravity of the second encapsulating material.

9. The device of claim 6, further comprising a phosphor interspersed with the first encapsulating material.

10. The device of claim 6, having a mean thermal resistance of 160 to 225° C./Watt.

11. A method of encapsulating a semiconductor device, comprising:
    placing the semiconductor device into a package;
    placing a first encapsulating material into the package; and
    placing a second encapsulating material having a higher thermal conductivity than the first encapsulating material into the package;
    wherein the semiconductor device comprises a light emitting diode chip and a lead frame electrically coupled to the light emitting diode chip;
    wherein the first encapsulating material is located above a radiation emitting surface of the light emitting diode chip;
    wherein the second encapsulating material is located below the radiation emitting surface of the light emitting diode chip; and
    the package comprises a shell containing the first and second encapsulating materials.

12. The method of claim 11, further comprising partially curing the first encapsulating material after placing the first encapsulating material and the light emitting diode chip into the shell.

13. The method of claim 12, further comprising fully curing the first and second encapsulating materials after placing the second encapsulating material into the shell.

14. The method of claim 11, wherein:
    a specific gravity of the first encapsulating material is lower than the specific gravity of the second encapsulating material; and
    the step of placing the first encapsulating material into the package comprises injecting the first encapsulating material into the package such that the first encapsulating material rises to the top of the package.

15. The method of claim 14, wherein:
    the steps of placing the first encapsulating material and placing the second encapsulating material into the package occur simultaneously, such that the second encapsulating material separates from the first encapsulating material and lowers to the bottom of the package; and
    further comprising fully curing the first and second encapsulating materials.

16. The method of claim 11, further comprising interspersing a phosphor with the first encapsulating material.

17. The method of claim 11, wherein:
    the first encapsulating material comprises BPA epoxy; and
    the second encapsulating material comprises epoxy containing thermally conductive metal, silica or diamond particles.

18. A method of encapsulating a semiconductor device, comprising:

placing the semiconductor device into an enclosure;

simultaneously placing a first encapsulating material and a second encapsulating material having a higher thermal conductivity than the first encapsulating material into the enclosure;

wherein a specific gravity of the first encapsulating material is lower than a specific gravity of the second encapsulating material such that the first encapsulating material with the lower specific gravity separates above the second encapsulating material with the higher specific gravity;

wherein the semiconductor device comprises a semiconductor light emitting diode chip;

wherein the first encapsulating material absorbs less light emitting diode radiation than the second transparent or opaque encapsulating material; and wherein the first encapsulating material is located above a radiation emitting surface of the light emitting diode chip and the second encapsulating material is located below the radiation emitting surface of the light emitting diode chip.

19. The method of claim 18, wherein the semiconductor device comprises a light emitting diode chip and the enclosure comprises a transparent shell.

20. The method of claim 19, further comprising holding the shell with a radiation emitting side up during the step of placing the first and second encapsulating materials, such that the first encapsulating material having a lower specific gravity than the second encapsulating material rises toward the radiation emitting side of the shell.

21. An encapsulated device, comprising:

a solid state device, wherein the solid state device comprises a semiconductor light emitting diode chip;

a first encapsulating material; and a second encapsulating material having a higher thermal conductivity than the first encapsulating material;

wherein the first encapsulating material absorbs less light emitting diode radiation than the second transparent or opaque encapsulating material;

wherein the first encapsulating material is located above a radiation emitting surface of the light emitting diode chip and the second encapsulating material is located below the radiation emitting surface of the light emitting diode chip;

wherein the first and second encapsulating materials comprise polymer materials; and wherein the first encapsulating material comprises BPA epoxy and the second encapsulating material comprises epoxy containing thermally conductive metal, silica or diamond particles.

22. The device of claim 21, further comprising a carrier substrate containing at least two electrodes and a cavity containing the light emitting diode chip.

23. An encapsulated device, comprising:

a solid state device, wherein the solid state device comprises a semiconductor light emitting diode chip;

a first encapsulating material; and a second encapsulating material having a higher thermal conductivity than the first encapsulating material;

wherein the first encapsulating material absorbs less light emitting diode radiation than the second transparent or opaque encapsulating material;

wherein the first encapsulating material is located above a radiation emitting surface of the light emitting diode chip and the second encapsulating material is located below the radiation emitting surface of the light emitting diode chip;

wherein the first and second encapsulating materials comprise polymer materials; and wherein a specific gravity of the first encapsulating material is lower than a specific gravity of the second encapsulating material.

24. A packaged light emitting diode, comprising:

a light emitting diode chip;

a lead frame electrically coupled to the light emitting diode chip;

a first encapsulating material above a radiation emitting surface of the light emitting diode chip; and a second encapsulating material below the radiation emitting surface of the light emitting diode chip having a higher thermal conductivity than the first encapsulating material;

wherein the device has a mean thermal resistance of 160 to 225° C./Watt.

* * * * *